(12) United States Patent
Oh et al.

(10) Patent No.: US 11,665,835 B2
(45) Date of Patent: May 30, 2023

(54) LIGHT COVER FOR AN INFORMATION HANDLING SYSTEM

(71) Applicant: Dell Products L.P., Round Rock, TX (US)

(72) Inventors: Guentaek Oh, Singapore (SG); Kyung Eun Lee, Singapore (SG)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/670,100

(22) Filed: Oct. 31, 2019

(65) Prior Publication Data

US 2021/0136932 A1   May 6, 2021

(51) Int. Cl.
*H05K 5/00* (2006.01)
*H05K 5/03* (2006.01)
*F21V 8/00* (2006.01)

(52) U.S. Cl.
CPC ......... *H05K 5/0017* (2013.01); *G02B 6/0013* (2013.01); *G02B 6/0081* (2013.01); *H05K 5/03* (2013.01)

(58) Field of Classification Search
CPC ...................................................... H05K 7/00
See application file for complete search history.

(56) References Cited

U.S. PATENT DOCUMENTS

| | | | |
|---|---|---|---|
| 2011/0116218 A1* | 5/2011 | Choi | H04N 5/64 361/679.01 |
| 2015/0018041 A1* | 1/2015 | Gorilovsky | G06F 1/1626 455/558 |
| 2017/0205654 A1* | 7/2017 | Iwaki | G02F 1/133308 |
| 2017/0212556 A1* | 7/2017 | Jovanovic | G06F 1/1652 |

* cited by examiner

*Primary Examiner* — Jerry Wu
(74) *Attorney, Agent, or Firm* — McDermott Will & Emery LLP

(57) ABSTRACT

Systems and methods are disclosed for a light cover that may include a blocking portion configured to block a light emitted from a light-emitting diode, the blocking portion having a first shape associated with a heated state in which the blocking portion extends vertically in parallel with a lower portion of an optical sheet, the first shape configured to minimize a gap between the lower portion of the optical sheet and the blocking portion; a mounting portion configured to contact a bottom portion of a cover bottom of the display, the mounting portion extending orthogonally from the blocking portion; and a plurality of mounting pegs disposed on interior portions of the mounting portion, each of the plurality of mounting pegs configured to removably couple the mounting portion of the light cover to the bottom portion of the cover bottom.

10 Claims, 6 Drawing Sheets

LIGHT COVER FOR AN INFORMATION HANDLING SYSTEM

BACKGROUND

Field of the Disclosure

The disclosure relates generally to information handling systems, and in particular to a light cover structure for an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

In one embodiment, a disclosed light cover includes a blocking portion configured to block a light emitted from a light-emitting diode (LED), the blocking portion having a first shape associated with a heated state in which the blocking portion extends vertically in parallel with a lower portion of an optical sheet, the first shape configured to minimize a gap between the lower portion of the optical sheet and the blocking portion; a mounting portion configured to contact a bottom portion of a cover bottom of the display, the mounting portion extending orthogonally from a base of the blocking portion; and a plurality of mounting pegs disposed on interior portions of the mounting portion, each of the plurality of mounting pegs configured to removably couple the mounting portion of the light cover to the bottom portion of the cover bottom.

In one or more of the disclosed embodiments, the light cover is comprised of a semi-rigid material.

In one or more of the disclosed embodiments, the semi-rigid material is comprised of a shape-memory alloy.

In one or more of the disclosed embodiments, the blocking portion further comprises: a second shape associated with cooled state in which the blocking portion extends diagonally away from the lower portion of the optical sheet, the second shape configured to widen the gap between the lower portion of the optical sheet and the blocking portion to avoid scratching the lower portion of the optical sheet during an installation of the light cover.

In one or more of the disclosed embodiments, the widened gap between the lower portion of the optical sheet and the blocking portion is greater than 0.2 millimeters.

In one or more of the disclosed embodiments, the second shape is formed by mechanically deforming the blocking portion of the light cover while the blocking portion is in the cooled state.

In one or more of the disclosed embodiments, the light emitted from the LED causes the heated state of the blocking portion.

In one or more of the disclosed embodiments, the minimized gap between the lower portion of the optical sheet and the blocking portion is less than 0.2 millimeters.

In one or more of the disclosed embodiments, the first shape is formed while the blocking portion of the light cover is in the heated state.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
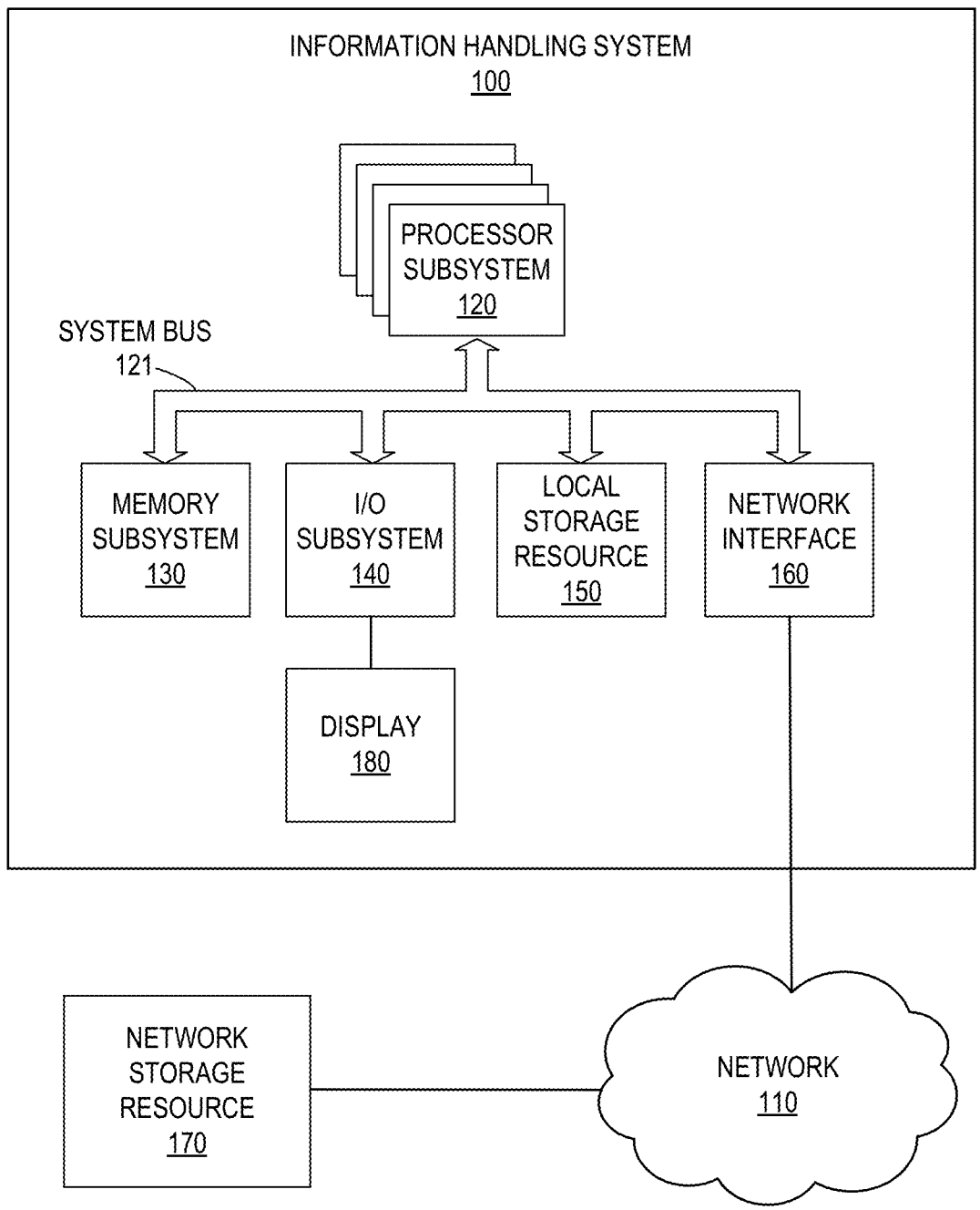
FIG. 1 is a block diagram of selected elements of an embodiment of an information handling system.

This document describes a light cover for an information handling system that may include a blocking portion configured to block a light emitted from a light-emitting diode (LED), the blocking portion having a first shape associated with a heated state in which the blocking portion extends vertically in parallel with a lower portion of an optical sheet, the first shape configured to minimize a gap between the lower portion of the optical sheet and the blocking portion; a mounting portion configured to contact a bottom portion of a cover bottom of the display, the mounting portion extending orthogonally from a base of the blocking portion; and a plurality of mounting pegs disposed on interior portions of the mounting portion, each of the plurality of mounting pegs configured to removably couple the mounting portion of the light cover to the bottom portion of the cover bottom.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-5 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140 communicatively coupled to a display 180, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

In information handling system 100, display 180 may comprise a system, device, or apparatus generally operable to display information processed by information handling system 100. In particular, display 180 may be or include an output device comprised of circuity configured to display information to a user, a casing to house the circuitry, and a power supply. In one embodiment, display 180 may be or include a liquid crystal display (LCD) with light-emitting diode (LED) backlighting. In other embodiments, display 180 may be or include a cathode ray tube (CRT) monitor, an LED monitor, a plasma display panel monitor, and/or any other type of monitor suitable for displaying information processed by information handling system 100.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Figure 2:
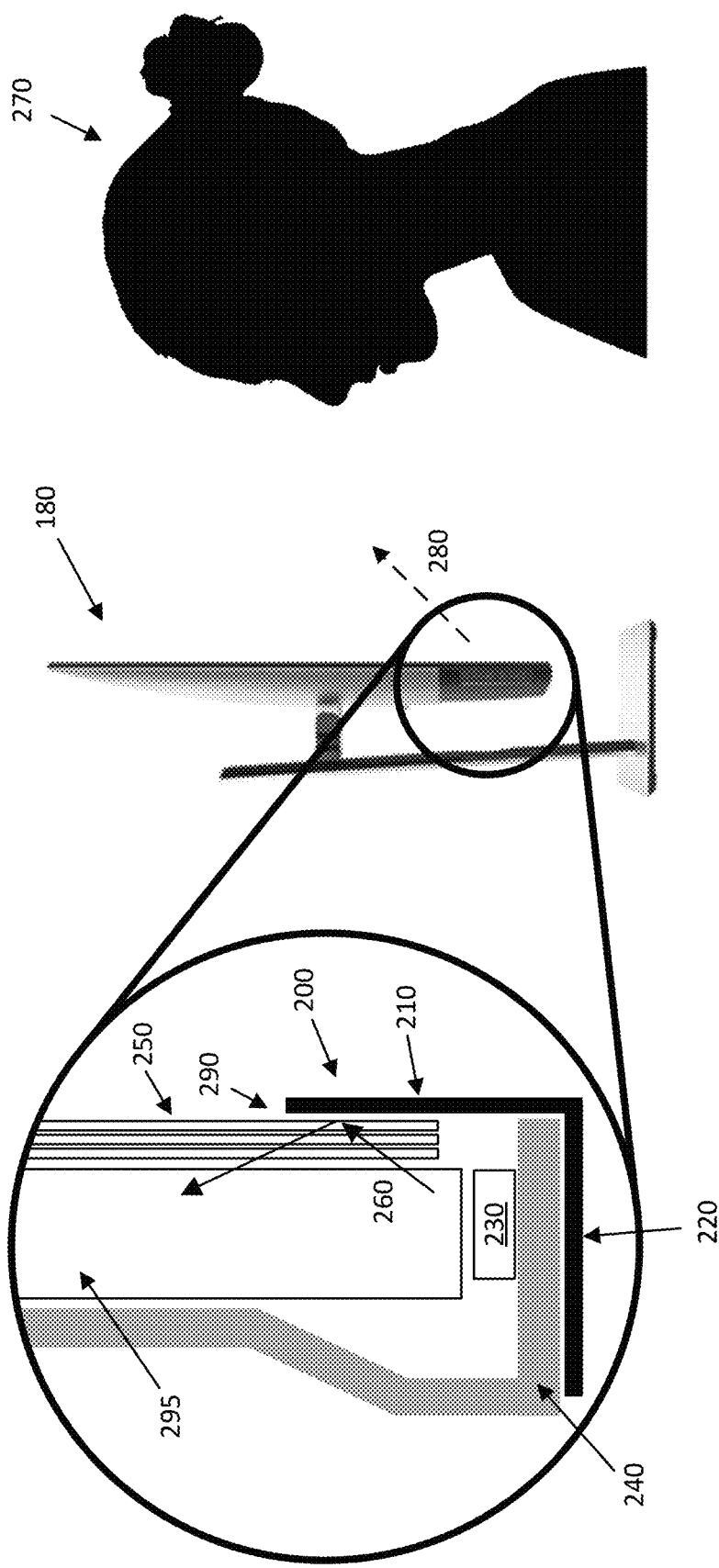
FIG. 2 is a side view of an embodiment of a light cover in a display of an information handling system.

FIG. 2 is a side view of an embodiment of a light cover in a display of an information handling system. In the embodiment illustrated in FIG. 2, display 180 includes a light cover 200, an LED 230, a cover bottom 240, a light guide plate (LGP) 295, and an optical sheet 250. Light cover includes a blocking portion 210 and a mounting portion 220.

In the embodiment illustrated in FIG. 2, LED 230 may be a suitable system, apparatus, or device operable to illuminate display 180. In particular, LED 230 may be or include a semiconductor light source used to supply backlighting to illuminate components of display 180 such that information may be displayed to a user 270. For example, LED 230 may emit light into a light guide plate (LGP) used to distribute the light evenly throughout display 180. In another example, LED 230 may emit light through one or more optical sheets 250 of display 180. In one embodiment, LED 230 may comprise one or more LEDs used for an edge-lit display. In another embodiment, LED 230 may provide backlighting for a back-lit display. In other embodiments, LED 230 may be oriented in any manner suitable for illuminating display 180.

In the embodiment illustrated in FIG. 2, optical sheet 250 may be a suitable system, apparatus, or device operable to enhance images provided to a user 270 on display 180. In one embodiment, optical sheet 250 may be comprised of one or more optical sheets such that each optical sheet enhances the image in a specific manner. In one instance, an optical sheet 250 may be or include a diffuser that diffuses light emitted by LED 230 for enhanced picture quality. In another instance, an optical sheet may be or include a prism that gathers light emitted from LED 230 to provide display 180 with high luminance. In other embodiments, optical sheet 250 may include additional, fewer, or any suitable combination of optical sheets used to enhance images for presentation to a user 270 on display 180.

In the embodiment illustrated in FIG. 2, cover bottom 240 may be a suitable system, apparatus, or device operable to support one or more optical components of display 180. In particular, cover bottom 240 may be or include a metal material configured to mount LED 230 such that LED 230 may emit light vertically throughout display 180. This is illustrated in FIG. 2 where LED 230 is mounted above cover bottom 240 emitting light 260 throughout components of display 180 above (e.g., optical sheet 250, LGP 295, and the like). In addition, cover bottom 240 may be configured to mount light cover 200 such that the light emitted from LED 230 does not exit display 180. Specifically, cover bottom 240 may include a bottom portion that includes one or more holes configured to receive mounting pegs (not shown in figure) disposed on interior portions of a mounting portion 220 of light cover 200.

In the embodiment illustrated in FIG. 2, light cover 200 may be a suitable system, apparatus, or device operable to block light leakage from display 180 of information handling system 100. In particular, light cover 200 may be comprised of a semi-rigid material used to block light emitted from LED 230, or other light source, that supplies backlighting in display 180. Light cover 200 may ensure that light emitted from LED 230 is contained within display 180 (e.g., a casing of display 180) without allowing light to exit display 180. However, LED 230 may generate high temperatures within display 180 while illuminated. For example, LED 230 may reach over 80° C. in instances of high luminance design. Conventionally, these high temperatures could cause a mechanical deformation in a light cover comprised of metal. This mechanical deformation may cause the light cover to allow light leakage 280 from display 180 that may be visible to a user 270. In contrast, light cover 200 may be comprised of a semi-rigid material (e.g., a shape-memory alloy) capable of returning to a formed shape when heat is applied, or when light cover 200 is in a "heated state." Specifically, light cover 200 may be formed while in a heated state such that light cover 200 may retain its formed shape when heat is applied (e.g., heat generated from LED 230). In addition, light cover 200 may retain its formed shape when cooled from a high temperature, or when light cover 200 is in a "cooled state." These properties allow light cover 200 to withstand high temperatures generated by LED 230 without mechanical deformation, thereby effectively blocking light leakage from display 180. In one embodiment, light cover 200 may include a blocking portion 210 and a mounting portion 220.

In the embodiment illustrated in FIG. 2, blocking portion 210 may be a suitable system, apparatus, or device operable to block light from exiting display 180. In particular, blocking portion 210 may block light 260 emitted from LED 230 from exiting display 180 via gap 290 between blocking portion 210 and optical sheet 250. In one embodiment, light cover 200 may be formed while in a heated state prior to installation in display 180. Here, blocking portion 210 may be formed such that blocking portion 210 extends vertically in parallel with a lower portion of optical sheet 250. This is illustrated in FIG. 2 where blocking portion 210 forms an approximate right angle with mounting portion 220 of light cover 200. This formed shape, or "first shape," is configured to minimize the gap 290 between the lower portion of optical sheet 250 and blocking portion 210, thereby blocking light 260 from exiting via gap 290. Similarly, light cover 200 may be mechanically deformed while in a cooled state. Here, blocking portion 210 may be formed such that blocking portion 210 extends diagonally away from the lower portion of optical sheet 250. This mechanically deformed shape, or "second shape," is configured to widen the gap 290 between the lower portion of optical sheet 250 and blocking portion 210 such that light cover 200 may be installed without damaging nearby components. Specifically, light cover 200 may be installed while in the cooled state with blocking portion 210 in the second shape to avoid scratching, or otherwise damaging, optical sheet 250. It is noted that a size of gap 290 may vary based on product size and/or design. For example, a small-sized display may have a gap 0.15 mm while a large-sized display may have a gap of 0.25 mm. Blocking portion 210 is discussed further with respect to FIGS. 3A and 3B.

In the embodiment illustrated in FIG. 2, mounting portion 220 may be a suitable system, apparatus, or device operable to mount, or "removably couple," light cover 200 to cover bottom 240. In one embodiment, mounting portion 220 may include mounting pegs (not shown in figure) configured to removably couple light cover 200 to a bottom portion of cover bottom 240. In another embodiment, mounting portion 220 may include one or more holes such that mounting portion 220 may be secured to the bottom portion of cover bottom 240 with screws, nails, or any other type of mechanical fastener suitable for removably coupling mounting portion 220 to cover bottom 240. In the embodiment illustrated in FIG. 2, mounting portion extends orthogonally from a base of blocking portion 210 forming an approximate right angle.

Figure 3A:
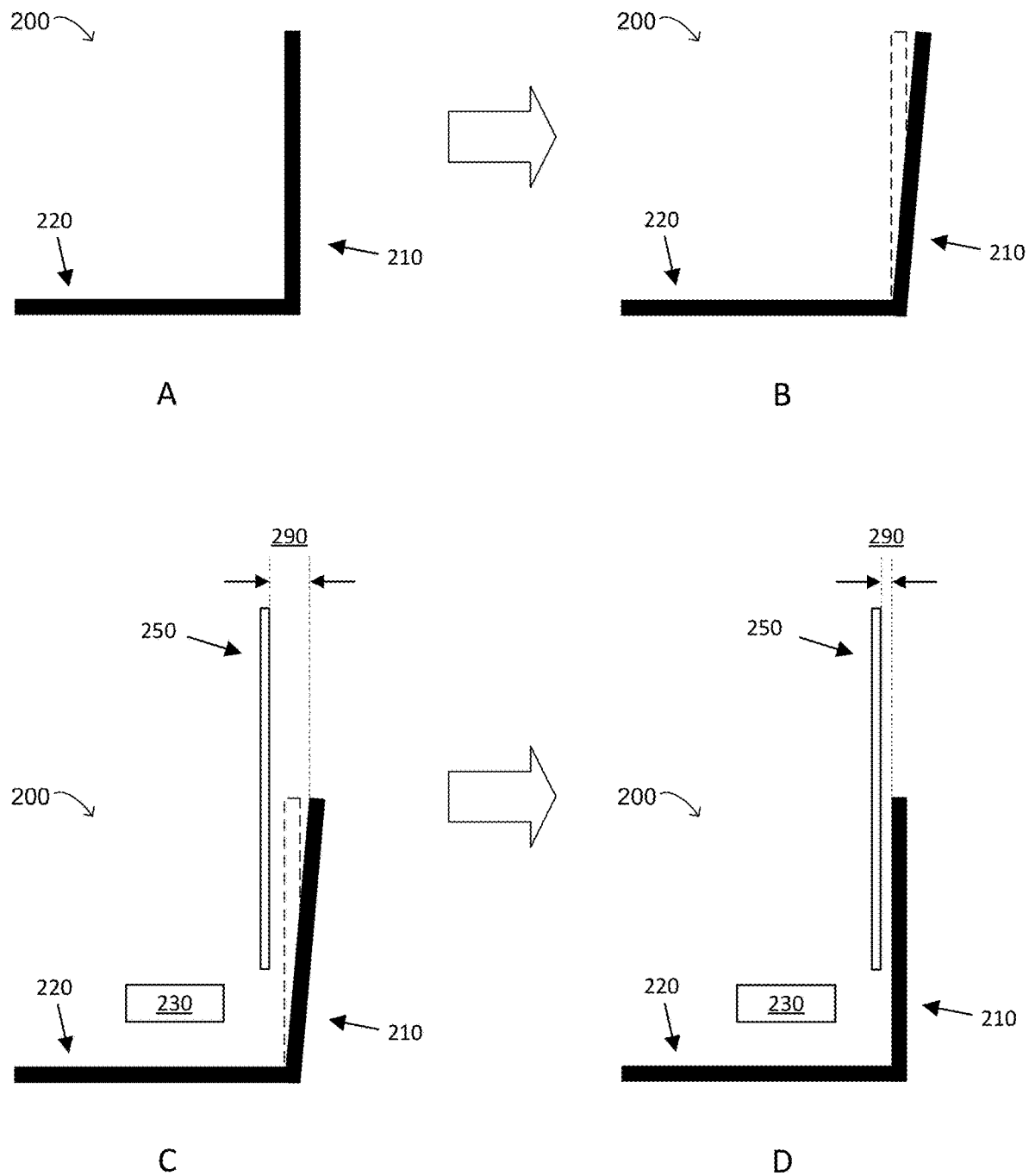
FIG. 3A is a side view of an embodiment of a process for installing a light cover in a display of an information handling system.

FIG. 3A is a side view of an embodiment of a process for installing a light cover in a display of an information handling system. In the embodiment illustrated in FIG. 3A, light cover 200 may be comprised of a shape-memory alloy capable of being formed into a first shape while in a heated state and mechanically deformed into a second shape while in a cooled state. Light cover 200 may return to the first shape when heat is applied. Specifically, a first shape of light cover 200 may be defined at high temperatures for a given duration of time. Subsequently, light cover 200 may be brought to a cooled state and mechanically deformed into a second shape. While in the second shape, light cover 200 may undergo a temperature-induced phase transformation in which the mechanical deformation may be reversed such that light cover 200 again returns to the first shape. That is, when the shape-memory alloy comprising the light cover 200 is in the cooled state, the metal can be bent or stretched into a second shape such that it can maintain the second shape until heated above a transition temperature (i.e., the heated state). When heated, the shape-memory alloy comprising light cover 200 may return to the first shape defined at high temperature. When cooled again, the shape-memory alloy comprising light cover 200 may remain in the first shape until mechanically deformed. This one-way memory effect allows light cover 200 to be installed in display 180 while in a cooled state and to be returned to its first shape when brought to a heated state.

In phase A shown in FIG. 3A, light cover 200 may be formed into a first shape while in a heated state. For example, a manufacturer or administrator of information handling system 100 may cause a heated state in blocking portion 210 by subjecting light cover 200 to a high temperature (e.g., 400-500° C.) for a sustained duration of time (e.g., 30 minutes). While in the heated state, blocking portion 210 may be formed into a first shape such that blocking portion 210 may return to the first shape when brought to the heated state. As shown in FIG. 3A, the first shape of blocking portion 210 may form an approximate right angle with mounting portion 220. As shown in FIG. 2, this first shape may be configured to minimize the gap 290 between the lower portion of optical sheet 250 and blocking portion 210, thereby blocking light 260 from exiting via gap 290.

In phase B shown in FIG. 3A, the temperature of light cover 200 may be reduced from that associated with the heated state to a temperature associated with a cooled state. In one embodiment, the temperature may be reduced rapidly by quenching light cover 200 in water. In another embodiment, the temperature may be reduced by cooling light cover 200 with air. While in the cooled state, blocking portion 210 may be formed into a second shape such that blocking portion 210 may return to the first shape when brought to the heated state. This second shape may be configured to widen the gap 290 between the lower portion of optical sheet 250 and blocking portion 210.

In phase C shown in FIG. 3A, light cover 200 may be installed in display 180. Specifically, light cover 200 may be installed while blocking portion 210 is in the second shape by removably coupling mounting pegs (not shown in figure) disposed on interior portions of mounting portion 220 to a bottom portion of cover bottom 240. To maintain the cooled state, LED 230 may remain unilluminated during installation. As shown in FIG. 3A, light cover 200 may be installed such that blocking portion 210 extends diagonally away from the lower portion of optical sheet 250 to avoid scratching, or otherwise damaging, optical sheet 250 during installation. Because blocking portion 210 extends away from optical sheet 250, gap 290 is widened to a size that may permit light leakage from display 180. For example, gap 290 may be greater than 0.2 millimeters (mm) which may allow light to exit display 180 via gap 290. Therefore, light cover 200 may be returned to the first shape by returning to the heated state when installation is complete and LED 230 is illuminated.

In phase D shown in FIG. 3A, the temperature of light cover 200 may be increased from that associated with the cooled state to a temperature associated with the heated state. To increase the temperature to that associated with the heated state, LED 230 may remain illuminated following installation of light cover 200. In response to returning to the heated state, blocking portion 210 may return to the first shape formed in phase A. Specifically, the blocking portion 210 may extend vertically in parallel with the lower portion of optical sheet 250 in order to minimize the gap 290 between the lower portion of optical sheet 250 and blocking portion 210. Here, gap 290 may be minimized such that blocking portion 210 may block light from exiting display 180 via gap 290. For example, gap 290 may be between 0.1 mm and 0.2 mm to effectively block light leakage from display 180. Blocking portion 210 may remain in the first shape despite heated and/or cooled states following installation thereby effectively blocking light leakage without mechanical deformation.

Figure 3B:
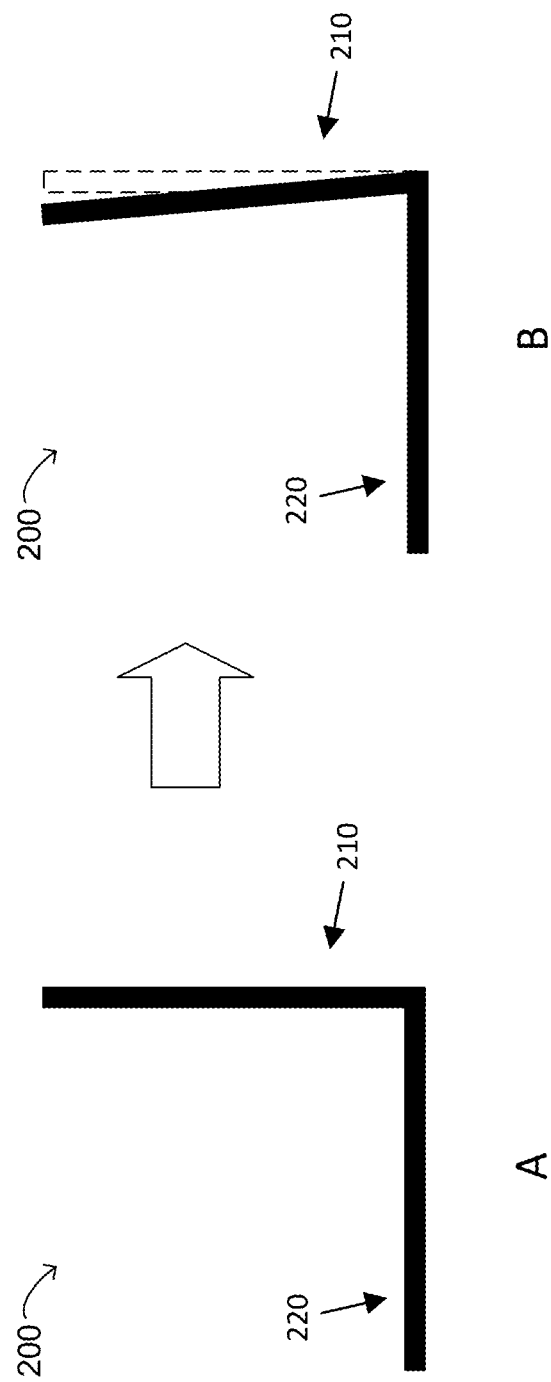
FIG. 3B is a side view of an embodiment of a light cover having an acute angle.

FIG. 3B is a side view of an embodiment of a light cover having an acute angle. In the embodiment illustrated in FIG. 3B, the second shape of light cover 200 in phase B may comprise an acute angle in which blocking portion 210 extends diagonally toward mounting portion 220. Specifically, one or more external forces may be inadvertently applied during phase B (and/or installation in phase C shown in FIG. 3A) that cause blocking portion 210 and mounting portion 220 to form an angle of less than 90°. Because this acute angle may result in damage to optical sheet 250 during installation of light cover 200, instances of significant acute deformation (e.g., less than 85°) may be addressed in a screening process prior to installation. For example, a manufacturing operator and/or administrator of information handling system 100 may form light cover 200 into the second shape illustrated in phase B of FIG. 3A to ensure that the light cover 200 will not cause damage to nearby components during installation. Similar to the second shape having an obtuse angle shown in phase B of FIG. 3A, a second shape of light cover 200 having an acute angle may be heated such that blocking portion 210 can return to the first shape shown in phase A when brought to the heated state.

Figure 4A:
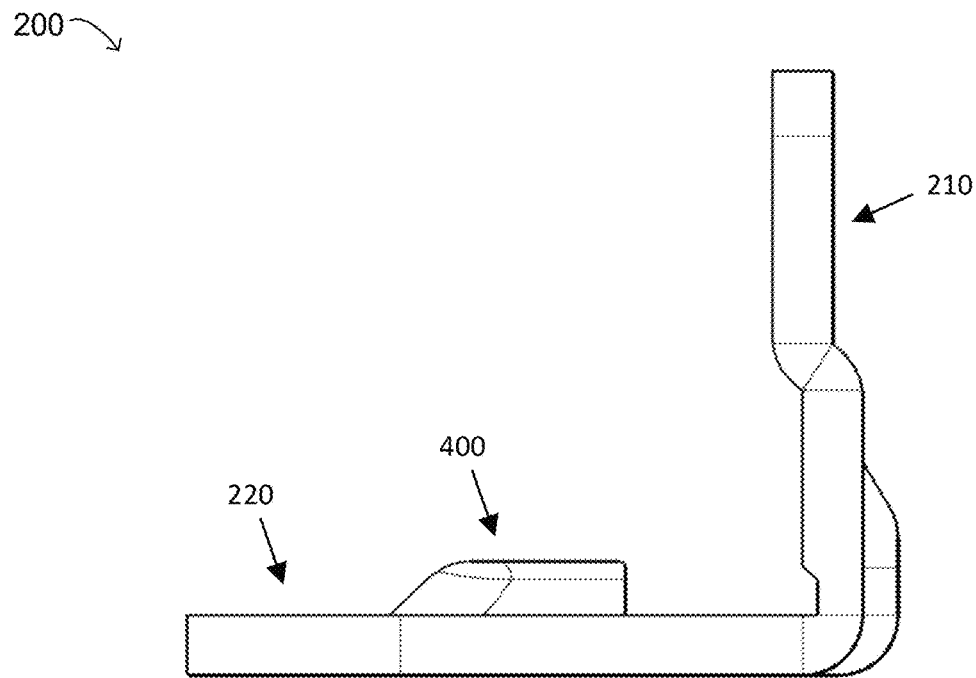
FIG. 4A is a side view of an embodiment of a light cover that includes mounting pegs for removably coupling the light cover to a cover bottom.

FIG. 4A is a side view of an embodiment of a light cover that includes mounting pegs for removably coupling the light cover to a cover bottom. In the embodiment illustrated in FIG. 4A, one or more mounting pegs 400 may be disposed on interior portions of mounting portion 220 of light cover 200. Each mounting peg 400 disposed on mounting portion 220 may be configured to removably couple mounting portion 220 to a bottom portion of cover bottom 240 as described with respect to FIG. 2. In particular, the bottom portion of cover bottom 240 may include one or more holes configured to receive mounting pegs 400 as mounting portion 220 makes contact with the bottom portion of cover bottom 240 during installation.

Figure 4B:
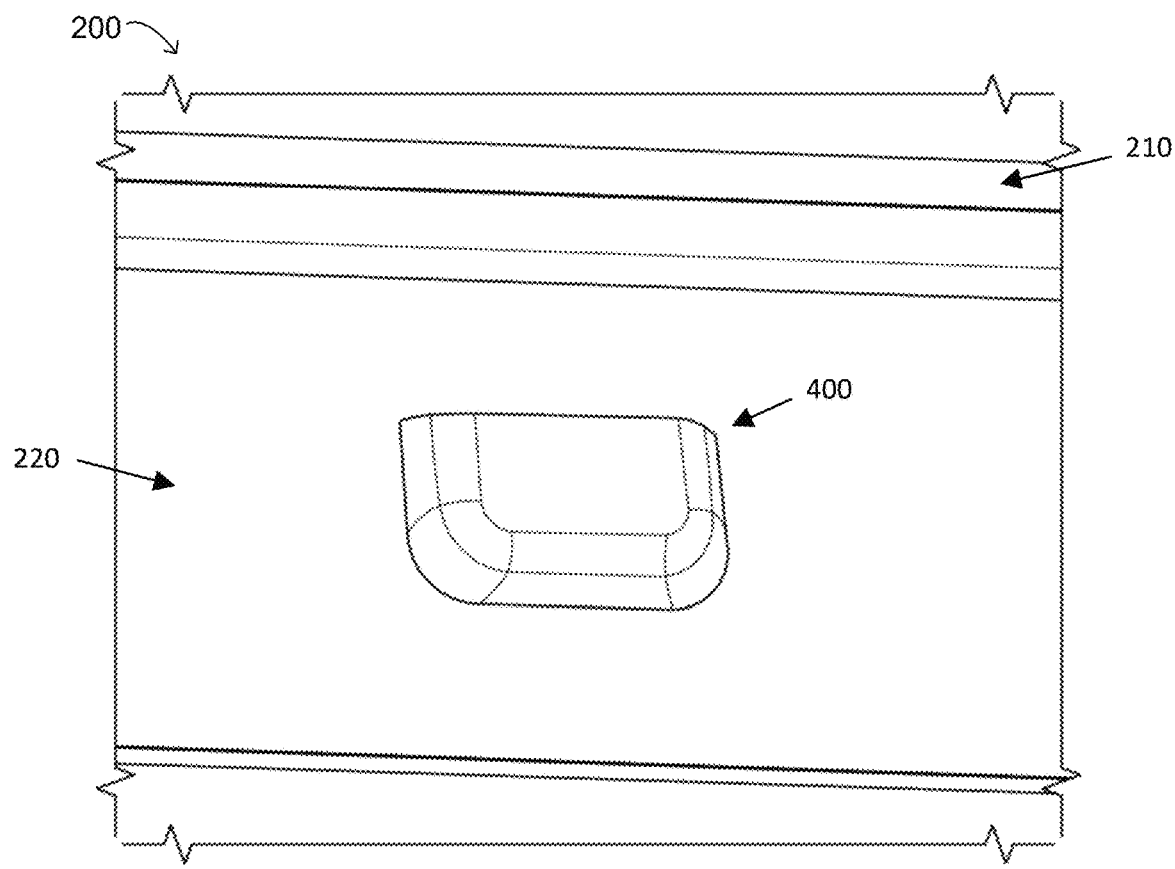
FIG. 4B is a top view of an embodiment of a light cover that includes mounting pegs for removably coupling the light cover to a cover bottom.

FIG. 4B is a top view of an embodiment of a light cover that includes mounting pegs for removably coupling the light cover to a cover bottom. In the embodiment illustrated in FIG. 4B, mounting peg 400 may extend vertically from the interior portion of mounting portion 220 such that the interior portion of mounting portion 220 may be removably coupled to the bottom portion of cover bottom 240. In other embodiments, light cover 200 may be secured to the bottom portion of cover bottom 240 with screws, nails, or any other type of mechanical fastener suitable for removably coupling mounting portion 220 to cover bottom 240.

Figure 5:
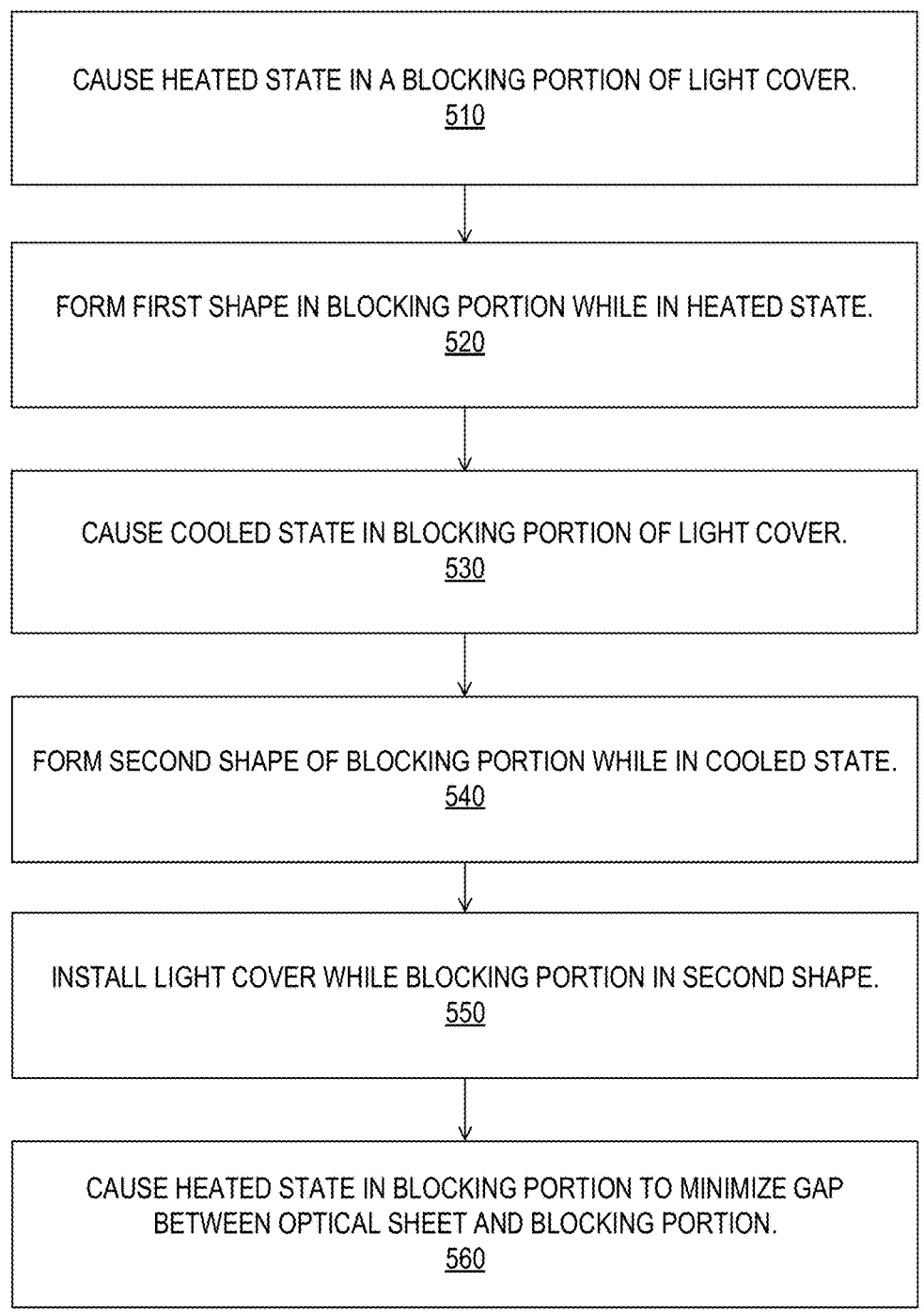
FIG. 5 is a flowchart depicting selected elements of an embodiment of a method for installing a light cover in an information handling system.

FIG. 5 is a flowchart depicting selected elements of an embodiment of a method for installing a light cover in an information handling system. It is noted that certain operations described in method 500 may be optional or may be rearranged in different embodiments.

Method 500 may begin at step 510, where a heated state may be caused in a blocking portion 210 of light cover 200. For example, a manufacturer or administrator of information handling system 100 may cause a heated state in blocking portion 210 by subjecting light cover 200 to a high temperature for a sustained duration of time. Blocking portion 210 may be configured to block a light emitted from a light-emitting diode (LED) 230. In step 520, blocking portion 210 may be formed into a first shape while in the heated state. For example, blocking portion 210 may be formed into the first shape illustrated in phase A of FIGS. 3A and 3B. In step 530, a cooled state may be caused in blocking portion 210 of light cover 200. For example, the temperature may be reduced by quenching light cover 200 in water and/or by cooling with air. In step 540, blocking portion 210 may be formed into a second shape while in the cooled state. As shown in FIG. 3A, the second shape may be configured to widen a gap 290 between a lower portion of optical sheet 250 of display 180 and blocking portion 210 during an installation of light cover 200. The second shape may be formed by mechanically deforming blocking portion 210. In step 550, light cover 200 may be installed while blocking portion 210 is in the second shape by removable coupling mounting pegs 400 disposed on interior portions of mounting portion 220 to a bottom portion of cover bottom 240. As shown in FIG. 3A, blocking portion 210 may extend diagonally away from the lower portion of optical sheet 250 to widen gap 290 during installation. For example, gap 290 may be greater than 0.2 mm. In step 560, the heated state may be caused in blocking portion 210 to form the first shape of blocking portion 210. As shown in FIG. 3A, the blocking portion 210 may extend vertically in parallel with the lower portion of optical sheet 250 in order to minimize the gap 290 between the lower portion of optical sheet 250 and blocking portion 210. For example, gap 290 may be between 0.1 mm and 0.2 mm to effectively block light leakage from display 180.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A light cover to block light leakage from a display of an information handling system, the light cover comprising: a blocking portion configured to block light emitted from a light-emitting diode (LED) of the display, the blocking portion formed from a shape-memory alloy, the blocking portion including a first end positioned opposite to a second end; and a mounting portion coupled to a bottom portion of a cover bottom of the display, the mounting portion extending orthogonally from the second end of the blocking portion, wherein, when the blocking portion is in a first state, the blocking portion has a first shape in which the blocking portion extends vertically in parallel with a lower portion of an optical sheet of the display to define a first shortest distance from i) the lower portion of the optical sheet of the display to ii) the first end of the blocking portion; and wherein, when the blocking portion is in a second state, the blocking portion has a second shape, differing from the first shape, in which the blocking portion extends diagonally away from the lower portion of the optical sheet of the display to define a second shortest distance from i) the lower portion of the optical sheet of the display to ii) the first end of the blocking portion and an angle between the blocking portion and the lower portion is less than 45 degree, wherein a temperature associated with the first state is greater than a temperature associated with the second state, wherein the second distance is greater than the first distance; when the blocking portion is in the second state, the blocking portion extends diagonally away from the lower portion of the optical sheet of the display to define a third shortest distance from i) the lower portion of the optical sheet of the display to ii) a middle point of the blocking portion, the middle point between the first end of the blocking portion and the second end of the blocking portion, wherein the third distance is greater than the first distance and less than the second distance.

2. The light cover of claim 1, wherein the light cover is comprised of a semi-rigid material.

3. The light cover of claim 1, wherein the second distance is greater than 0.2 millimeters.

4. The light cover of claim 1, wherein the first distance is less than 0.2 millimeters.

5. A method for installing a light cover in an information handling system, the method comprising: causing a first state, associated with a first temperature, in a blocking portion of the light cover, the blocking portion configured to block light emitted from a light-emitting diode (LED), the blocking portion formed from a shape-memory alloy, the blocking portion including a first end positioned opposite to a second end; forming a first shape of the blocking portion while the blocking portion is in the first state; causing a second state, associated with a second temperature, in the blocking portion of the light cover; forming a second shape of the blocking portion, differing from the first shape, while the blocking portion is in the second state; installing the light cover while the blocking portion is in the second shape by coupling a mounting portion of the light cover to a bottom portion of the cover bottom of the display, the mounting portion extending orthogonally from the second end of the blocking portion; and causing the second state in the blocking portion of the light cover, wherein, when the blocking portion is in the first state, the blocking portion has the first shape in which the blocking portion extends vertically in parallel with a lower portion of an optical sheet of the display to define a first shortest distance from i) the lower portion of the optical sheet of the display to ii) the first end of the blocking portion, wherein when the blocking portion is in a second state, the blocking portion has a second shape, differing from the first shape, in which the blocking portion extends diagonally away from the lower portion of the optical sheet of the display to define a second shortest distance from i) the lower portion of the optical sheet of the display to ii) the first end of the blocking portion and an angle between the blocking portion and the lower portion is less than 45 degree, wherein a temperature associated with the first state is greater than a temperature associated with the second state, wherein the second distance is greater than the first distance; when the blocking portion is in the second state, the blocking portion extends diagonally away from the lower portion of the optical sheet of the display to define a third shortest distance from i) the lower portion of the optical sheet of the display to ii) a middle point of the blocking portion, the middle point between the first end of the blocking portion and the second end of the blocking portion, wherein the third distance is greater than the first distance and less than the second distance.

6. The method of claim 5, wherein the light cover is comprised of a semi-rigid material.

7. An information handling system, comprising: at least one processor; a display, comprising: a light-emitting diode (LED); an optical sheet; a cover bottom; and a light cover configured to block a light leakage from the display, the light cover comprising: a blocking portion configured to block light emitted from the LED of the display, the blocking portion formed from a shape-memory alloy, the blocking portion including a first end positioned opposite to a second end; and a mounting portion coupled to a bottom portion of a cover bottom of the display, the mounting portion extending orthogonally from the second end of the blocking portion, wherein, when the blocking portion is in a first state, the blocking portion has a first shape in which the blocking portion extends vertically in parallel with a lower portion of an optical sheet of the display to define a first shortest distance from i) the lower portion of the optical sheet of the display to ii) the first end of the blocking portion; and wherein, when the blocking portion is in a second state, the blocking portion has a second shape, differing from the first shape, in which the blocking portion extends diagonally away from the lower portion of the optical sheet of the display to define a second shortest distance from i) the lower portion of the optical sheet of the display to ii) the first end of the blocking portion and an angle between the blocking portion and the lower portion is less than 45 degree, wherein a temperature associated with the first state is greater than a temperature associated with the second state, wherein the second distance is greater than the first distance; when the blocking portion is in the second state, the blocking portion extends diagonally away from the lower portion of the optical sheet of the display to define a third shortest distance from i) the lower portion of the optical sheet of the display to ii) a middle point of the blocking portion, the middle point between the first end of the blocking portion and the second end of the blocking portion, wherein the third distance is greater than the first distance and less than the second distance.

8. The information handling system of claim 7, wherein the light cover is comprised of a semi-rigid material.

9. The information handling system of claim 7, wherein the second distance is greater than 0.2 millimeters.

10. The information handling system of claim 7, wherein the first distance is less than 0.2 millimeters.

\* \* \* \* \*